United States Patent [19]

Kao et al.

[11] Patent Number: 5,422,576
[45] Date of Patent: Jun. 6, 1995

[54] MAGNETIC RESONANCE ANGIOGRAPHY USING FAST SPIN ECHO PULSE SEQUENCE

[75] Inventors: Yi-Hsuan Kao; Patrick A. Turski; Stefan S. Winkler, all of Madison, Wis.

[73] Assignee: Wisconsin Alumni Research Foundation, Madison, Wis.

[21] Appl. No.: 90,725

[22] Filed: Jul. 13, 1993

[51] Int. Cl.6 ............................................. G01R 33/20
[52] U.S. Cl. .................................. 324/309; 324/307; 128/653.2
[58] Field of Search ................ 324/300, 307, 309, 306; 128/653.2

[56] References Cited

U.S. PATENT DOCUMENTS

| | | | |
|---|---|---|---|
| 4,777,957 | 10/1988 | Wehrli et al. | 324/309 |
| 5,034,694 | 7/1991 | Sattin et al. | 324/309 |
| 5,189,369 | 2/1993 | Takane et al. | 324/307 |
| 5,248,942 | 9/1993 | Ratzel et al. | 324/309 |
| 5,271,399 | 12/1993 | Listerud et al. | 324/309 |

OTHER PUBLICATIONS

Extracranial Carotid Arteries: Evaluation with "Black Blood" MR Angiography, *Radiology* R. R. Edelman, et al., Oct. 1990, vol. 177, pp. 45–50.
Turbofisp Black Blood Angiography, *SMRM* 1991, Chien, et al.
High Speed Black Blood Imaging of Stenosis in the Presence of Pulsatile Flow, *SMRM* 1991, Chien, et al.
MR Angiography: Present and Future, *AJR* 1993; 161:1–11, R. R. Edelman.
Brain Hemorrhage: Evaluation with Fast Spin-Echo and Conventional Dual Spin-Echo Images, *RSNA*, 1992 pp. 53–58, K. M. Jones, et al.
Image Enhancement/Image Sharpening, *Digital Image Processing* 2nd Edition, pp. 176–183, R. C. Gonzalez.

*Primary Examiner*—Sandra L. O'Shea
*Assistant Examiner*—Raymond Y. Mah
*Attorney, Agent, or Firm*—Quarles & Brady

[57] ABSTRACT

An NMR system performs a dual-echo fast-spin-echo scan to acquire two NMR data sets from which proton density-weighted and $T_2$-weighted images may be reconstructed. The two NMR data sets are combined to produce a composite NMR data set from which a black blood NMR angiogram is produced by a minimum intensity projection.

7 Claims, 3 Drawing Sheets

MAGNETIC RESONANCE ANGIOGRAPHY USING FAST SPIN ECHO PULSE SEQUENCE

BACKGROUND OF THE INVENTION

The field of the invention is nuclear magnetic resonance imaging methods and systems. More particularly, the invention relates to the production of a black blood magnetic resonance angiogram ("MRA") from a fast spin echo scan.

Any nucleus which possesses a magnetic moment attempts to align itself with the direction of the magnetic field in which it is located. In doing so, however, the nucleus precesses around this direction at a characteristic angular frequency (Larmor frequency) which is dependent on the strength of the magnetic field and on the properties of the specific nuclear species (the magnetogyric constant $\gamma$ of the nucleus). Nuclei which exhibit this phenomena are referred to herein as "spins".

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. A net magnetic moment $M_z$ is produced in the direction of the polarizing field, but the randomly oriented magnetic components in the perpendicular, or transverse, plane (x-y plane) cancel one another. If, however, the substance, or tissue, is subjected to a magnetic field (excitation field B1) which is in the x-y plane and which is near the Larmor frequency, the net aligned moment, Mz, may be rotated, or "tipped", into the x-y plane to produce a net transverse magnetic moment $M_t$, which is rotating, or spinning, in the xy plane at the Larmor frequency. The practical value of this phenomenon resides in the signal which is emitted by the excited spins after the excitation signal B1 is terminated. There are a wide variety of measurement sequences in which this nuclear magnetic resonance ("NMR") phenomena is exploited.

When utilizing NMR to produce images, a technique is employed to obtain NMR signals from specific locations in the subject. Typically, the region which is to be imaged (region of interest) is scanned by a sequence of NMR measurement cycles which vary according to the particular localization method being used. The resulting set of received NMR signals are digitized and processed to reconstruct the image using one of many well known reconstruction techniques. To perform such a scan, it is, of course, necessary to elicit NMR signals from specific locations in the subject. This is accomplished by employing magnetic fields ($G_x$, $G_y$, and $G_z$) which have the same direction as the polarizing field $B_0$, but which have a gradient along the respective x, y and z axes. By controlling the strength of these gradients during each NMR cycle, the spatial distribution of spin excitation can be controlled and the location of the resulting NMR signals can be identified.

Most NMR scans currently used to produce medical images require many minutes to acquire the necessary data. The reduction of this scan time is an important consideration, since reduced scan time increases patient throughput, improves patient comfort, and improves image quality by reducing motion artifacts. There are a number of fast pulse sequences available on commercial NMR scanners which enable fast scans to be performed. One of these fast pulse sequences is the fast-spin-echo ("FSE") pulse sequence, also known as the Rapid Acquisition Relaxation Enhanced (RARE) sequence which is described by J. Hennig et al in an article in *Magnetic Resonance in Medicine* 3,823–833 (1986) entitled "RARE Imaging: A Fast Imaging Method for Clinical MR." The FSE sequence utilizes RF refocused echoes generated from a Carr-Purcell-Meiboom-Gill sequence to produce multiple spin echo signals from a single excitation pulse. Each pulse sequence, or "shot," results in the acquisition of a plurality of views, and a plurality of shots are typically employed to acquire a complete set of image data. For example, an FSE pulse sequence might acquire 8 separate echo signals, per shot, and an image requiring 256 views would, therefore, require 32 shots.

In clinical scans using FSE pulse sequences, more than one image is often acquired during a single scan. The images depict the same structures in the patient, but different tissues are enhanced in each image. The tissue contrast in each image is affected by intrinsic NMR parameters, such as proton density and $T_1$ and $T_2$ values. Those tissues having a higher proton density or shorter $T_1$ value will be bright in the first-echo image. Such tissues include, for example, fat, gray matter and white matter. On the other hand, those tissues such as cerebrospinal fluid, edema and tumor that have longer $T_2$ values, but not very long $T_1$ values as compared to the repetition time TR, will be bright in the second-echo image. Such multi-image fast spin echo imaging sequences are described by N. Higuchi et al in an abstract in *Journal of Magnetic Resonance Imaging*, Vol. 1, No. 2, pg. 147, 1991 entitled "Two-Contrast RARE: A Fast Spin-Density and $T_2$-Weighted Imaging Method."

Magnetic resonance angiograms (MRA) are produced in scans which employ specialized NMR pulse sequences. There are two basic methods used in MR angiography. In one method, know as the "time-of-flight" or "inflow enhancement" method, enhancement occurs when unsaturated spins flow into a slice which has been excited by many radio-frequency (RF) pulses. If the time between RF pulses is much shorter than the $T_1$ relaxation rate of the tissues, the longitudinal magnetization does not have time to recover before the next RF pulse is applied. This results in reduced transverse magnetization and reduced signal when the magnetization is again tipped into the transverse plane by the next RF excitation pulse. The inflowing blood, on the other hand, will have seen no prior RF pulses and will therefore have a large longitudinal component of magnetization, which produces a larger transverse magnetization and a larger NMR signal. As a result, the flowing blood appears brighter in the reconstructed image. The second method, known as the "phase contrast" method, acquires two images in which the phase of the signals produced by moving blood is different. A bright image of the vascular structure is produced using the phase difference information in the two images. Such MRA scans employ separate programs which are dedicated solely to this purpose.

A variant of the conventional MR angiogram is the "black blood" angiogram in which flowing blood appears darker than surrounding stationary tissues. This method is described, for example, by Robert R. Edelman et al in "Extracranial Carotid Arteries: Evaluation With 'Black Blood' MR Angiography", *Radiology*, 1990; 177:45–50, by Daisy Chien et al. in "Turbofisp Black Blood Angiography", SMRM 1991; and by Daisy Chien et al. in "High Speed Black blood Imaging of Stenosis in the Presence of Pulsatile Flow", SMRM 1992. Black blood angiograms have significant clinical use, but they are produced with special purpose NMR scans using specially designed pulse sequences.

SUMMARY OF THE INVENTION

The present invention is a method for producing a black blood angiogram from clinical NMR images acquired using a dual-echo, fast-spin-echo pulse sequence. More specifically, an FSE scan is performed to acquire a first image data set ($S_1$) at a relatively short TE and a second image data set ($S_2$) at a relatively long TE, a composite image data set ($S_c$) is calculated from corresponding elements in the image data sets $S_1$ and $S_2$ $$[S_c = \sqrt{S^2_1 + (S_1 - S_2)^2}],$$

and a minimum intensity projection image is produced from the composite image data set $S_c$. To enhance contrast of small blood vessels, a spatial gradient filter may be applied to the composite image data set $S_c$ prior to the projection process, and RF saturation pulses may be employed prior to the scan to further darken the blood signal.

A general object of the invention is to provide a black blood angiogram using the NMR image data sets acquired during a dual-echo FSE scan. Blood has a low signal intensity in the first echo used in the first image data set $S_1$, and the signal from blood decays slower (i.e. larger $T_2$) than solid brain tissues and remains at nearly the same level in the second echo signal used in the second image data set $S_2$. As a result, the composite image data set $S_c$ has an increased contrast between blood vessels and other tissues. This contrast may be further enhanced by presaturating blood flowing into the image region to reduce the signal from blood and further darken the vessels. In addition, vessel edges may be enhanced using appropriate filters. As a result, black blood angiograms can be produced using the very same image data sets $S_1$ and $S_2$ acquired for other clinical purposes. There is no increase in scan time and the post processing is relatively simple.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims herein for interpreting the scope of the invention.

DESCRIPTION OF THE PREFERRED EMBODIMENT

Figure 1:
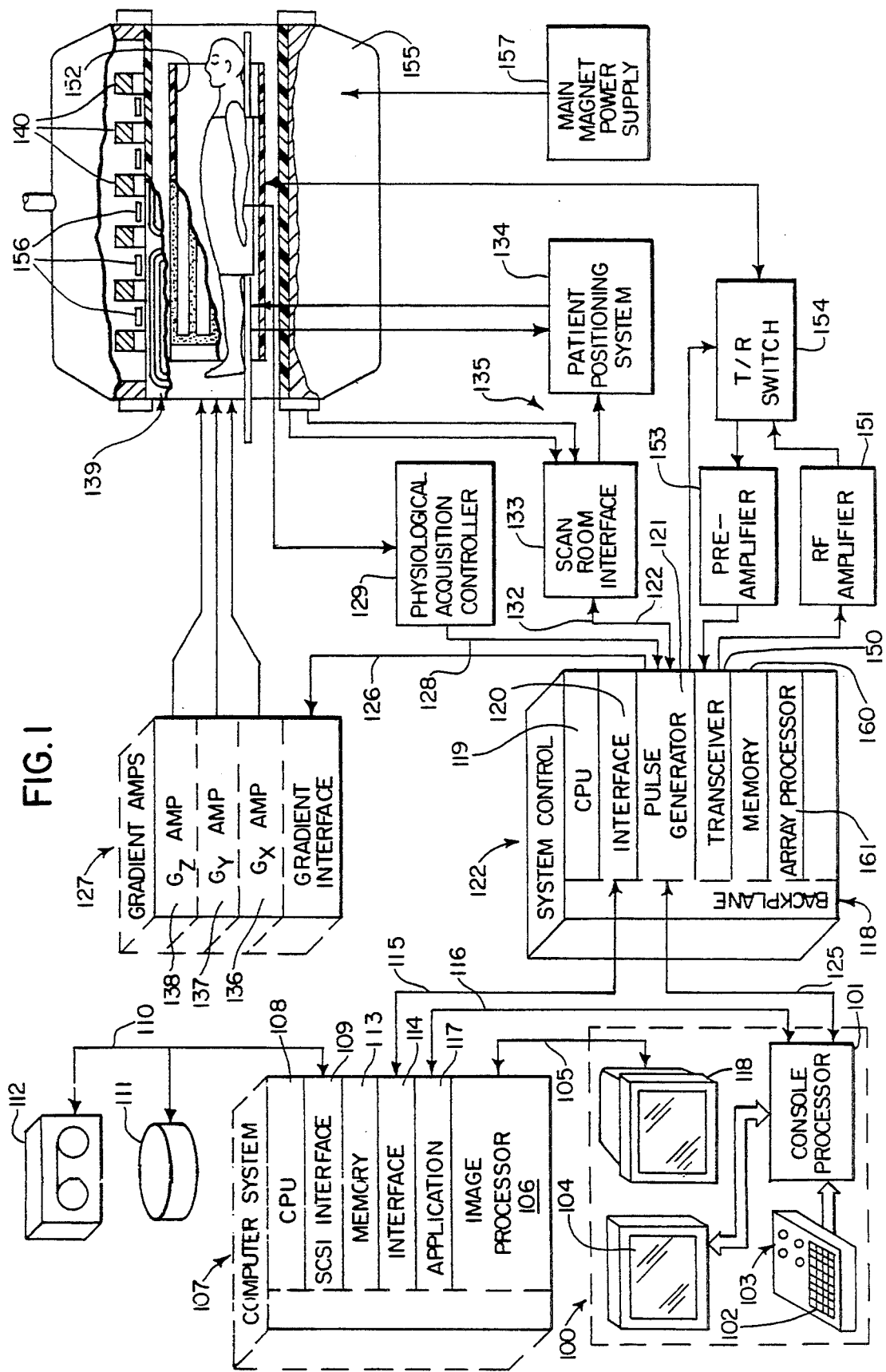
FIG. 1 is a block diagram of an NMR system which employs the present invention.

Referring first to FIG. 1, there is shown the major components of a preferred NMR system which incorporates the present invention and which is sold by the General Electric Company under the trademark "SIGNA". The operation of the system is controlled from an operator console 100 which includes a console processor 101 that scans a keyboard 102 and receives inputs from a human operator through a control panel 103 and a plasma display/touch screen 104. The console processor 101 communicates through a communications link 116 with an applications interface module 117 in a separate computer system 107. Through the keyboard 102 and controls 103, an operator controls the production and display of images by an image processor 106 in the computer system 107, which connects directly to a video display 118 on the console 100 through a video cable 105.

The computer system 107 is formed about a backplane bus, and it includes a number of modules which communicate with each other through this backplane. In addition to the application interface 117 and the image processor 106, these include a CPU module 108 that controls the backplane, and an SCSI interface module 109 that connects the computer system 107 through a bus 110 to a set of peripheral devices, including disk storage 111 and tape drive 112. The computer system 107 also includes a memory module 113, known in the art as a frame buffer for storing image data arrays, and a serial interface module 114 that links the computer system 107 through a high speed serial link 115 to a system interface module 120 located in a separate system control cabinet 122.

The system control 122 includes a series of modules which are connected together by a common backplane 118. The backplane 118 is comprised of a number of bus structures, including a bus structure which is controlled by a CPU module 119. The serial interface module 120 connects this backplane 118 to the high speed serial link 115, and pulse generator module 121 connects the backplane 118 to the operator console 100 through a serial link 125. It is through this link 125 that the system control 122 receives commands from the operator which indicate the scan sequence that is to be performed.

The pulse generator module 121 operates the system components to carry out the desired scan sequence. It produces data which indicates the timing, strength and shape of the RF pulses which are to be produced, and the timing of and length of the data acquisition window. The pulse generator module 121 also connects through serial link 126 to a set of gradient amplifiers 127, and it conveys data thereto which indicates the timing and shape of the gradient pulses that are to be produced during the scan. The pulse generator module 121 also receives patient data through a serial link 128 from a physiological acquisition controller 129. And finally, the pulse generator module 121 connects through a serial link 132 to scan room interface circuit 133 which receives signals at inputs 135 from various sensors associated with the position and condition of the patient and the magnet system. It is also through the scan room interface circuit 133 that a patient positioning system 134 receives commands which move the patient cradle and transport the patient to the desired position for the scan.

The gradient waveforms produced by the pulse generator module 121 are applied to a gradient amplifier system 127 comprised of $G_x$, $G_y$ and $G_z$ amplifiers 136, 137 and 138, respectively. Each amplifier 136, 137 and 138 is utilized to excite a corresponding gradient coil in an assembly generally designated 139. The gradient coil assembly 139 forms part of a magnet assembly 141 which includes a polarizing magnet 140 that produces either a 0.5 or a 1.5 Tesla polarizing field that extends horizontally through a bore 142. The gradient coils 139 encircle the bore 142, and when energized, they generate magnetic fields in the same direction as the main polarizing magnetic field, but with gradients $G_x$, $G_y$ and $G_z$ directed in the orthogonal x-, y- and z-axis directions of a Cartesian coordinate system. That is, if the magnetic field generated by the main magnet 140 is directed in the z direction and is termed $B_0$, and the total magnetic field in the z direction is referred to as $B_z$, then $G_x = \partial B_z/\partial x$, $G_y = \partial B_z/\partial y$ and $G_z = \partial B_z/\partial z$, and the magnetic field at any point (x,y,z) in the bore of the magnet assembly 141 is given by $B(x,y,z) = B_0 + G_x x + G_y y + G_z z$. The gradient magnetic fields are utilized to encode spatial information into the NMR signals emanating from the patient being scanned.

Located within the bore 142 is a circular cylindrical whole-body RF coil 152. This coil 152 produces a circularly polarized RF field in response to RF pulses provided by a transceiver module 150 in the system control cabinet 122. These pulses are amplified by an RF amplifier 151 and coupled to the RF coil 152 by a transmit-/receive switch 154 which forms an integral part of the RF coil assembly. Waveforms and control signals are provided by the pulse generator module 121 and utilized by the transceiver module 150 for RF carrier modulation and mode control. The resulting NMR signals radiated by the excited nuclei in the patient may be sensed by the same RF coil 152 and coupled through the transmit/receive switch 154 to a preamplifier 153. The amplified NMR signals are demodulated, filtered, and digitized in the receiver section of the transceiver 150. The transmit/receive switch 154 is controlled by a signal from the pulse generator module 121 to electrically connect the RF amplifier 151 to the coil 152 during the transmit mode and to connect the preamplifier 153 during the receive mode. The transmit/receive switch 154 also enables a separate RF coil (for example, a head coil or surface coil) to be used in either the transmit or receive mode.

In addition to supporting the polarizing magnet 140 and the gradient coils 139 and RF coil 152, the main magnet assembly 141 also supports a set of shim coil 156 associated with the main magnet 140 and used to correct inhomogeneities in the polarizing magnet field. The main power supply 157 is utilized to bring the polarizing field produced by the superconductive main magnet 140 to the proper operating strength and is then removed.

The NMR signals picked up by the RF coil 152 are digitized by the transceiver module 150 and transferred to a memory module 160 which is also part of the system control 122. When an entire array of data has been acquired in the memory modules 160, an array processor 161 operates to Fourier transform the data into an array of image data. This image data is conveyed through the serial link 115 to the computer system 107 where it is stored in the disk memory 111. This image data is processed by the image processor 106 as described in more detail below to produce the black blood angiogram according to the present invention. The resulting image is conveyed to the operator console 100 and presented on the video display 118.

Figure 2:
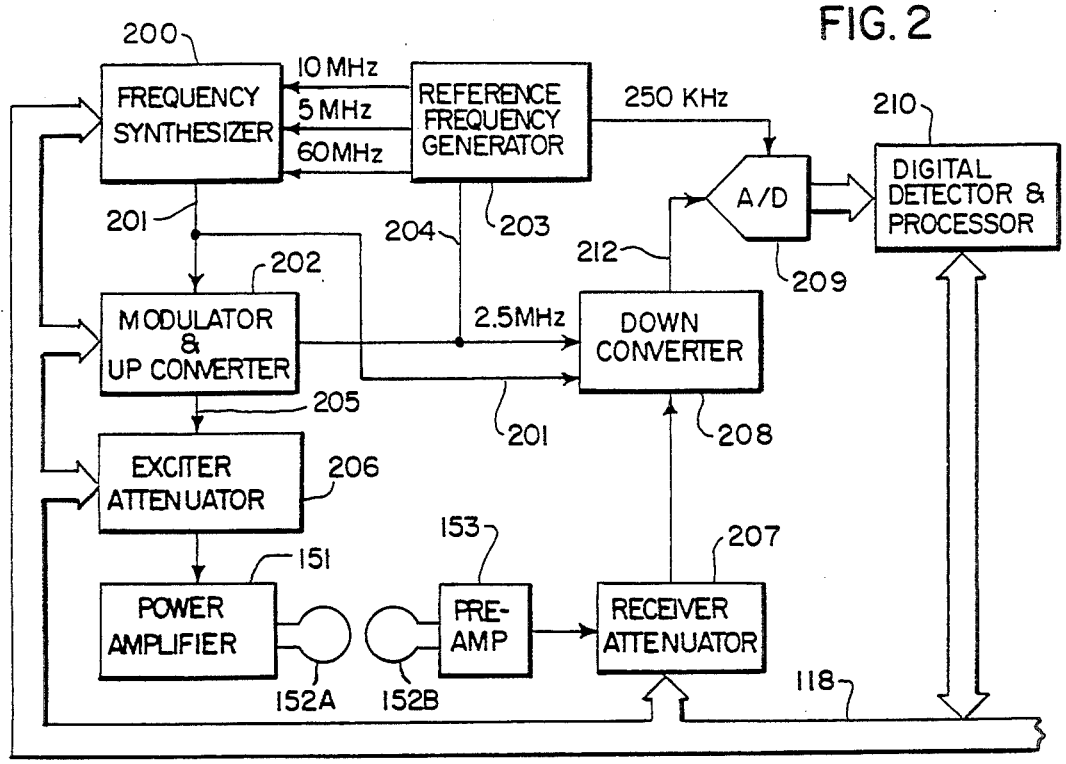
FIG. 2 is an electrical block diagram of the transceiver which forms part of the NMR system of FIG. 1.

Referring particularly to FIGS. 1 and 2, the transceiver 150 includes components which produce the RF excitation field B1 through power amplifier 151 at a coil 152A and components which receive the resulting NMR signal induced in a coil 152B. As indicated above, the coils 152A and B may be separate as shown in FIG. 2, or they may be a single wholebody coil as shown in FIG. 1. The base, or carrier, frequency of the RF excitation field is produced under control of a frequency synthesizer 200 which receives a set of digital signals (CF) through the backplane 118 from the CPU module 119 and pulse generator module 121. These digital signals indicate the frequency and phase of the RF carrier signal which is produced at an output 201. The commanded RF carrier is applied to a modulator and up converter 202 where its amplitude is modulated in response to a signal R(t) also received through the backplane 118 from the pulse generator module 121. The signal R(t) defines the envelope, and therefore the bandwidth, of the RF excitation pulse to be produced. It is produced in the module 121 by sequentially reading out a series of stored digital values that represent the desired envelope. These stored digital values may, in turn, be changed from the operator console 100 to enable any desired RF pulse envelope to be produced. The modulator and up converter 202 produces an RF pulse at the desired Larmor frequency at an output 205.

The magnitude of the RF excitation pulse output through line 205 is attenuated by an exciter attenuator circuit 206 which receives a digital command, TA, from the backplane 118. The attenuated RF excitation pulses are applied to the power amplifier 151 that drives the RF coil 152A. For a more detailed description of this portion of the transceiver 122, reference is made to U.S. Pat. No. 4,952,877 which is incorporated herein by reference.

Referring still to FIG. 1 and 2 the NMR signal produced by the subject is picked up by the receiver coil 152B and applied through the preamplifier 153 to the input of a receiver attenuator 207. The receiver attenuator 207 further amplifies the NMR signal and this is attenuated by an amount determined by a digital attenuation signal (RA) received from the backplane 118. The receive attenuator 207 is also turned on and off by a signal from the pulse generator module 121 such that it is not overloaded during RF excitation.

The received NMR signal is at or around the Larmor frequency, which in the preferred embodiment is around 63.86 MHz for 1.5 Tesla and 21.28 MHz for 0.5 Tesla. This high frequency signal is down converted in a two step process by a down converter 208 which first mixes the NMR signal with the carrier signal on line 201 and then mixes the resulting difference signal with the 2.5 MHz reference signal on line 204. The resulting down converted NMR signal on line 212 has a maximum bandwidth of 125 kHz and it is centered at a frequency of 187.5 kHz. The down converted NMR signal is applied to the input of an analog-to-digital (A/D) converter 209 which samples and digitizes the analog signal at a rate of 250 kHz. The output of the A/D converter 209 is applied to a digital detector and signal processor 210 which produce 16-bit in-phase (I) values and 16-bit quadrature (Q) values corresponding to the received digital signal. The resulting stream of digitized I and Q values of the received NMR signal is output through backplane 118 to the memory module 160 where they are employed to reconstruct an image.

To preserve the phase information contained in the received NMR signal, both the modulator and up converter 202 in the exciter section and the down converter 208 in the receiver section are operated with common signals. More particularly, the carrier signal at the output 201 of the frequency synthesizer 200 and the 2.5 MHz reference signal at the output 204 of the reference frequency generator 203 are employed in both frequency conversion processes. Phase consistency is thus maintained and phase changes in the detected NMR signal accurately indicate phase changes produced by the excited spins. The 2.5 MHz reference signal as well as 5, 10 and 60 MHz reference signals are produced by the reference frequency generator 203 from a common 20 MHz master clock signal. The latter three reference signals are employed by the frequency synthesizer 200 to produce the carrier signal on output 201. For a more detailed description of the receiver, reference is made to U.S. Pat. No. 4,992,736 which is incorporated herein by reference.

Figure 3:
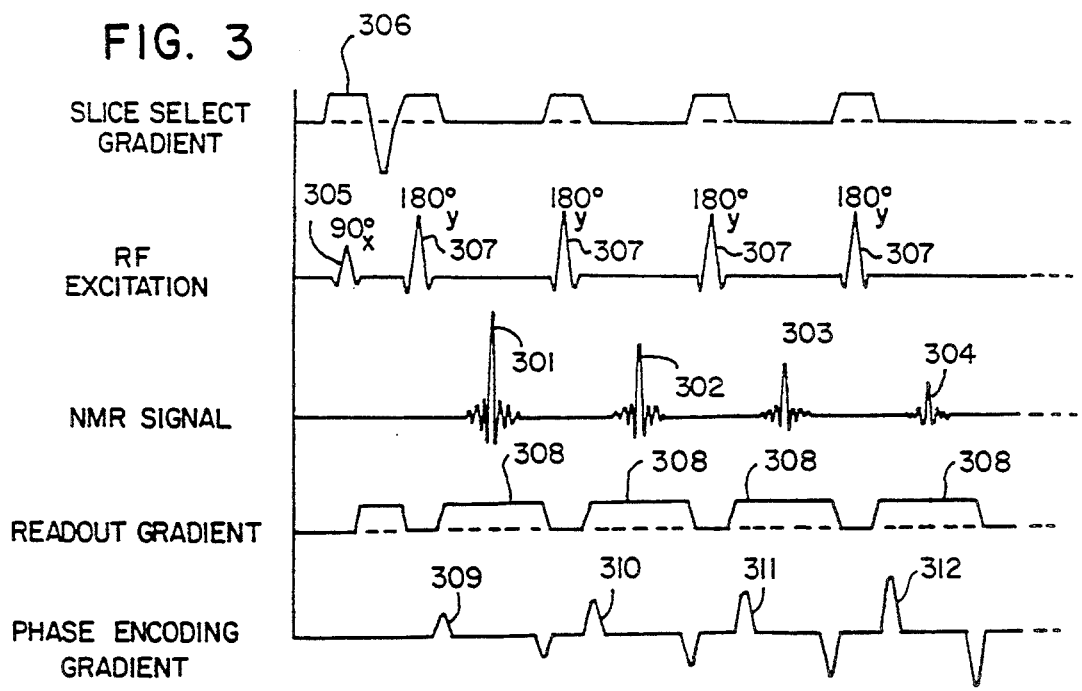
FIG. 3 is a graphic representation of the fast-spin-echo pulse sequence used to practice the preferred embodiment of the invention.

Referring particularly to FIG. 3, the fast-spin-echo MR pulse sequence employed to practice the preferred embodiment of the invention is a 2DFT sequence in which eight MR echo signals are acquired. For clarity, only four echo signals 301–304 are shown in FIG. 3, but it can be appreciated that four more are produced and acquired. These MR echo signals are produced by a 90° RF excitation pulse 305 which is generated in the presence of a $G_x$ slice select gradient pulse 306 to provide transverse magnetization in a slice through the patient. This transverse magnetization is refocused by each of eight selective 180° RF echo pulses 307 to produce the MR spin echo signals 301–304 that are acquired in the presence of $G_x$ readout gradient pulses 308. Each MR spin echo signal 301–304 is separately phase encoded by respective $G_y$ phase encoding pulses 309–312. The magnitude of each phase encoding pulse is different, and it is stepped through 256 values to acquire 256 separate views during a complete scan. Each MR spin echo signal is acquired by digitizing 256 samples of each signal and as a result, at the completion of a scan for one image, a 256 by 256 pixel image is produced by performing a 2D Fourier transformation on the acquired data.

Figure 5:
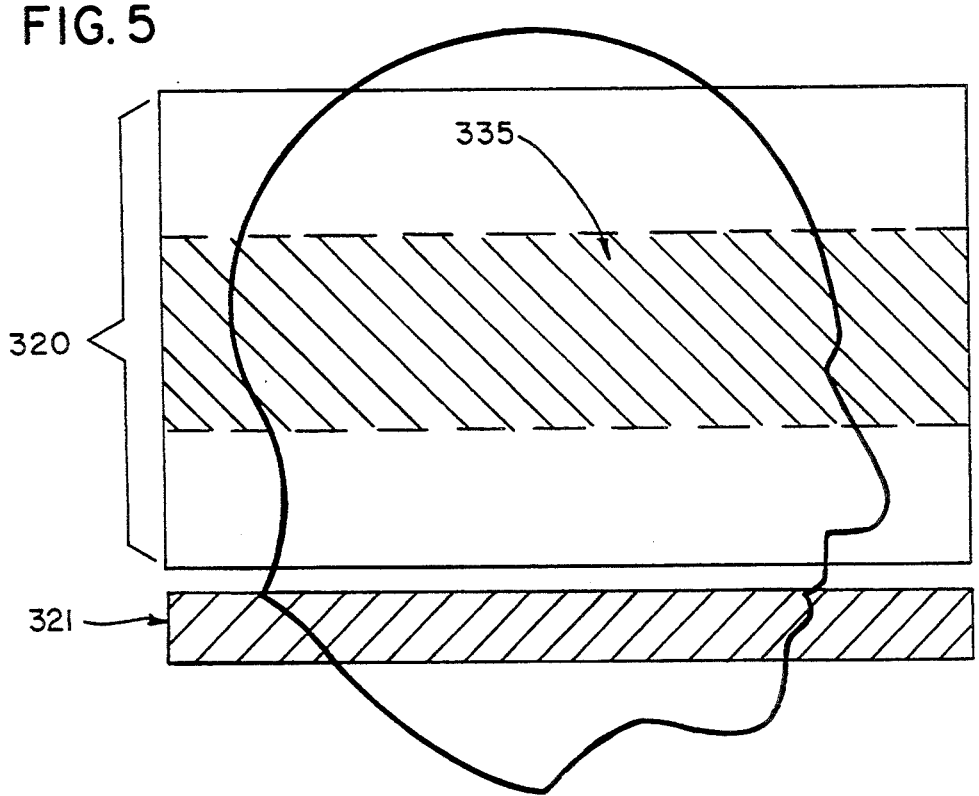
FIG. 5 is a pictorial representation of a patient showing an exemplary region from which NMR data is acquired during the scan.

The FSE pulse sequence employed in the preferred embodiment of the invention has a repetition time TR=3000 milliseconds. The echo time $TE_1$ is 18 milliseconds, with the first four echoes in each shot being used to form a first image data set $S_1$, and the last four echoes in each shot being used to form a second image data set $S_2$. The echo time for the second image data set is thus $TE_2=108$ milliseconds, and it is the substantial difference in echo times $TE_1$ and $TE_2$ between the two data sets $S_1$ and $S_2$ that provides the desired contrast exploited by the present invention. A complete scan includes 25 to 30 slices, with a slice thickness of 0.5 cm and a field of view of 18 to 22 cm. These transverse slices 320 may pass through the patient's brain, as shown in FIG. 5, and a selective presaturation pulse may be applied prior to each shot to saturate spins in a band 321 located beneath the image slices 320. As a result, blood flowing into the imaging region 320 from the neck is saturated and will not produce a strong NMR signal. This further darkens the vessels in the final image.

Figure 4:
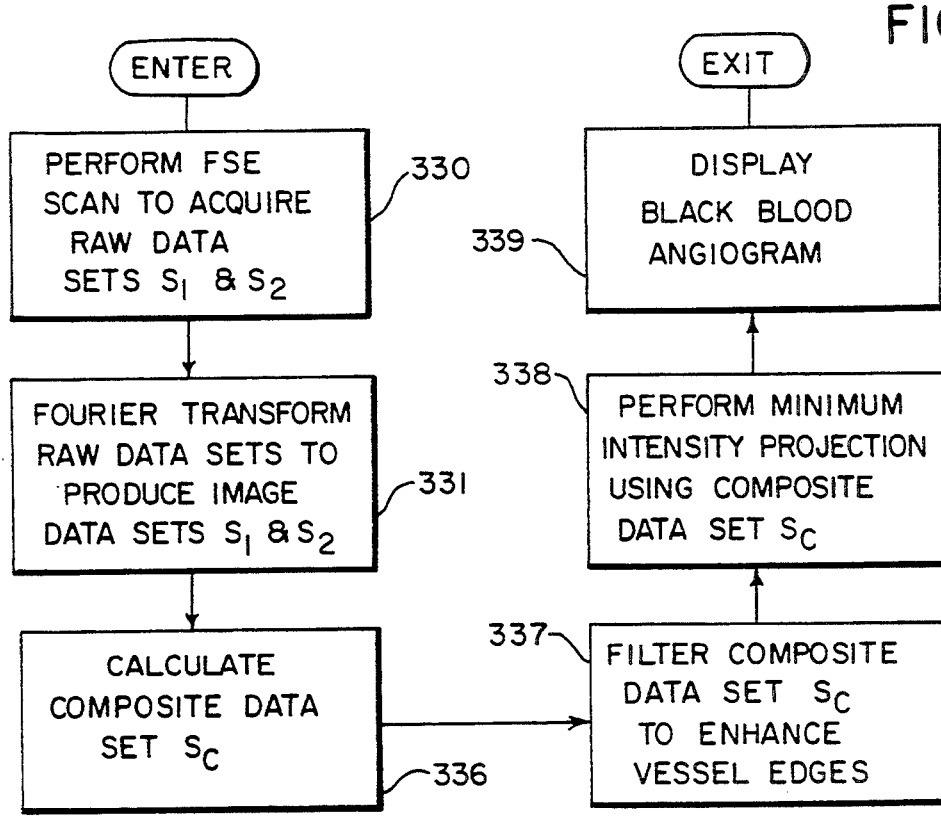
FIG. 4 is a flow chart of the procedure according to the present invention.

Referring particularly to FIG. 4, the method according to the preferred embodiment of the invention is carried out with the NMR system of FIGS. 1 and 2 using the FSE pulse sequence of FIG. 3. More specifically an FSE scan is performed, as indicated by process block 330, to acquire the two raw data sets $S_1$ and $S_2$. As indicated above, raw data set $S_1$ is 25 to 30 slices formed from the early echo signals ($TE_1$) and the raw data set $S_2$ is 25 to 30 slices formed from the late echo signals ($TE_2$). Each slice in each raw data set $S_1$ and $S_2$ is Fourier transformed as indicated at process block 331. This is a 2D digital fast Fourier transform performed by the array processor 161 (FIG. 1). The resulting 256 by 256 pixel image data sets $S_1$ and $S_2$ may be displayed in a conventional manner or stored for later use.

Referring to FIGS. 4 and 5, to produce a black blood angiogram according to the present invention a central set of slices in the image data sets $S_1$ and $S_2$ are combined to form a corresponding set of slices in a composite data set $S_c$. Twelve central slices 335 are selected in the preferred embodiment, and each pair of corresponding pixel values therein are combined as indicated at process block 336 according to the following expression:

$$S_c = \sqrt{S_1^2 + (S_1 - S_2)^2} \qquad [1]$$

While the resulting 12 by 256 by 256 array of composite data $S_c$ could be used to produce an angiogram directly, small vessels can be seen more clearly in the reconstructed image if an edge enhancement filter is applied as indicated at process block 337. In the preferred embodiment a spatial gradient filter such as that described by Rafael C. Gonzales and Paul Wintz in *Digital Image Processing—Second Edition*, pp. 176–179, published in 1987 by Addison-Wesley Publishing Company is employed. This spatial gradient filter is given by:

$$S_{out}(x,y,z) = S_{in}(x,y,z) - kG[S_{in}(x,y,z)] \qquad [2]$$

where $S_{in}(x,y,z)$ is the input intensity, $S_{out}(x,y,z)$ is the output intensity, k is a weighting coefficient, and $G[]$ is the magnitude of the spatial gradient within the slice given by $$G[S(x,y,z)] = \left[\left(\frac{\partial S}{\partial x}\right)^2 + \left(\frac{\partial S}{\partial y}\right)^2\right]^{\frac{1}{2}} \qquad [3]$$

$$G[S(x,y,z)] \approx \left|\frac{\partial S}{\partial x}\right| + \left|\frac{\partial S}{\partial y}\right|.$$

For simplicity of calculation, these partial derivatives are calculated as follows:

$$\left|\frac{\partial S}{\partial x}\right| = \frac{1}{2}|S(x,y) - S(x-1,y)| + \frac{1}{2}|S(x,y) - S(x+1,y)| \qquad [4]$$

$$\left|\frac{\partial S}{\partial Y}\right| = \frac{1}{2}|S(x,y) - S(x,y-1)| + \frac{1}{2}|S(x,y) - S(x,y+1)| \qquad [5]$$

Since edges also occur at the boundaries between gray and white matter, between gray matter and CSF, and between brain matter and bone, the gradient term is tempered by a weighting coefficient k, which is set by the operator and which typically has a value in the range 0.25 to 0.75.

As indicated at process block 338, the final step before displaying the angiogram at process block 339 is to perform a minimum intensity projection through the filtered array of image data 335. Such a projection is described by G. A. Laub and W. A. Kaiser in *Journal of Computer Assisted Tomography* 12, 377–382 (1988). In essence, rays are extended from each pixel location in the projection plane through the filtered array of image data 335. The minimum intensity value which the ray intersects as it passes through the image data array 335 is projected back to its corresponding pixel location in the projection image. This is repeated for each pixel in the 256 by 256 element projection image and the resulting black blood angiogram is displayed at process block 339.

There are a number of variations that can be made from the preferred embodiment of the invention without departing from the spirit of the invention. Susceptibility contrast agents can be injected into the patient to enhance dephasing of the blood spins and further darken the vessels in the angiogram. Other edge enhancement filters can be used to highlight small vessels, and such filters might be applied to the raw (k-space) NMR data before it is Fourier transformed.

We claim:

1. In an NMR system for producing images of a region of interest in a subject, the method comprising:

performing a fast-spin-echo scan in which a first NMR data set $S_1$ is acquired from NMR echo signals having a relatively short echo time $TE_1$ and a second NMR data set $S_2$ is acquired from NMR echo signals having a relatively long echo time $TE_2$;

calculating a composite NMR data set $S_c$ from corresponding values in the first and second NMR data sets $S_1$ and $S_2$ in accordance with the expression $$S_c = \sqrt{S_1^2 + (S_1 - S_2)^2};$$

and producing an image by projecting minimum intensity values in the composite NMR data set $S_c$.

2. The method as recited in claim 1 in which the composite NMR data set $S_c$ is filtered prior to producing an image to enhance edges in the image.

3. The method as recited in claim 2 in which the filtering is accomplished by a spatial gradient filter.

4. The method as recited in claim 1 in which spins flowing into the region of interest are saturated by the application of an RF saturation field adjacent to the region of interest and prior to the acquisition of the NMR echo signals.

5. The method as recited in claim 4 in which the region of interest is a human brain and the RF saturation field is applied to the neck of the human subject.

6. The method as recited in claim 3 in which the first and second NMR data sets $S_1$ and $S_2$ are acquired as a plurality of two-dimensional slices through the region of interest.

7. The method as recited in claim 6 in which the region of interest is a three-dimensional region in the head of a human subject, and the image is produced by projecting the minimum intensity values from a central portion of the composite NMR data set $S_c$, which corresponds with the human subject's brain.

* * * * *